US012273101B2

United States Patent
Sugiyama et al.

(10) Patent No.: US 12,273,101 B2
(45) Date of Patent: Apr. 8, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Toru Sugiyama, Tokyo (JP); Noriaki Yoshikawa, Tokyo (JP); Yasuhiko Kuriyama, Yokohama Kanagawa (JP); Akira Yoshioka, Yokohama Kanagawa (JP); Hitoshi Kobayashi, Yamato Kanagawa (JP); Hung Hung, Kawasaki Kanagawa (JP); Yasuhiro Isobe, Tokyo (JP); Tetsuya Ohno, Yokohama Kanagawa (JP); Hideki Sekiguchi, Yokohama Kanagawa (JP); Masaaki Onomura, Tokyo (JP)

(73) Assignees: Kabusbiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 29 days.

(21) Appl. No.: 18/167,301

(22) Filed: Feb. 10, 2023

(65) Prior Publication Data

US 2024/0097671 A1  Mar. 21, 2024

(30) Foreign Application Priority Data

Sep. 16, 2022 (JP) ................. 2022-147859

(51) Int. Cl.
 *H03K 17/16* (2006.01)
(52) U.S. Cl.
 CPC ... *H03K 17/162* (2013.01); *H03K 2217/0081* (2013.01)

(58) Field of Classification Search
 CPC .... H03K 17/16; H03K 17/161; H03K 17/162; H03K 2217/0081
 USPC ................................... 327/108, 109
 See application file for complete search history.

(56) References Cited

U.S. PATENT DOCUMENTS

| | | | |
|---|---|---|---|
| 8,054,110 B2 * | 11/2011 | Wang | H03K 19/018521 327/333 |
| 8,427,225 B2 | 4/2013 | Nakatake et al. | |
| 8,624,261 B2 | 1/2014 | Keda et al. | |
| 8,773,176 B2 | 7/2014 | Miyazaki et al. | |
| 9,660,639 B2 * | 5/2017 | Roberts | H03K 17/162 |
| 10,243,546 B2 * | 3/2019 | de Rooij | H03K 17/0406 |

(Continued)

FOREIGN PATENT DOCUMENTS

| | | |
|---|---|---|
| JP | 4954290 B2 | 6/2012 |
| JP | 5285103 B2 | 9/2013 |
| JP | 5791193 B2 | 10/2015 |

*Primary Examiner* — William Hernandez
(74) *Attorney, Agent, or Firm* — Kim & Stewart LLP (57) ABSTRACT

A semiconductor device includes a first transistor, a first drive circuit including a second transistor, and a second drive circuit including a third transistor. The second transistor and the third transistor are connected in series; and a connection node of the second and third transistors is connected to a gate electrode of the first transistor. The first transistor, the second transistor, and the third transistor are normally-off MOS HEMTs formed in a first substrate that includes GaN. The first drive circuit charges a parasitic capacitance of the first transistor. The second drive circuit discharges the parasitic capacitance of the first transistor.

19 Claims, 5 Drawing Sheets

(56) References Cited

U.S. PATENT DOCUMENTS

| | | | |
|---|---|---|---|
| 2012/0248565 A1* | 10/2012 | Tasaka | H03K 17/04123 |
| | | | 257/472 |
| 2013/0187713 A1* | 7/2013 | Acar | H03F 1/223 |
| | | | 330/251 |
| 2014/0346569 A1* | 11/2014 | Vielemeyer | H01L 27/0281 |
| | | | 257/195 |
| 2016/0233859 A1* | 8/2016 | Roberts | H01L 29/7787 |
| 2017/0104477 A1* | 4/2017 | Hughes | H01L 21/0242 |
| 2020/0091905 A1* | 3/2020 | Bernacchia | H03K 17/063 |

* cited by examiner

SEMICONDUCTOR DEVICE

CROSS-REFERENCE TO RELATED APPLICATIONS

This application is based upon and claims the benefit of priority from Japanese Patent Application No. 2022-147859, filed on Sep. 16, 2022; the entire contents of which are incorporated herein by reference.

FIELD

Embodiments described herein relate generally to a semiconductor device.

BACKGROUND

A nitride semiconductor device that includes a heterojunction of a nitride semiconductor such as GaN or the like can realize a higher breakdown voltage, a lower resistance, and faster operations than a semiconductor device using Si.

It is desirable to form the circuit driving such a high-speed switching element in the same chip as the output stage element to suppress the effects of the parasitic inductance of the wiring, etc. On the other hand, actual applications in which the output stage element and the drive circuit are formed in the same chip may be difficult unless the turn-on time and the turn-off time of the output stage element can be adjusted.

DETAILED DESCRIPTION

A semiconductor device according to an embodiment includes a first transistor, a first drive circuit, and a second drive circuit; the first transistor includes a first drain electrode connected to a drain electrode pad, a first source electrode connected to a source electrode pad, and a first gate electrode; the first drive circuit is connected to the source electrode pad and connected between a first electrode pad and a second electrode pad; a first voltage is input to the first electrode pad and used as a reference; a second voltage is input to the second electrode pad and is greater than the first voltage; the first drive circuit includes a second transistor; the second transistor includes a second drain electrode electrically connected to the second electrode pad, and a second source electrode connected to the first gate electrode of the first transistor; the second drive circuit is connected between the second transistor and the first electrode pad; the second drive circuit includes a third transistor; and the third transistor includes a third drain electrode connected to the first gate electrode, and a third source electrode connected to the source electrode pad. The first, second, and third transistors are formed in a first substrate including GaN. The first drive circuit charges a parasitic capacitance of the first transistor. The second drive circuit discharges the parasitic capacitance of the first transistor.

First Embodiment

Figure 1:
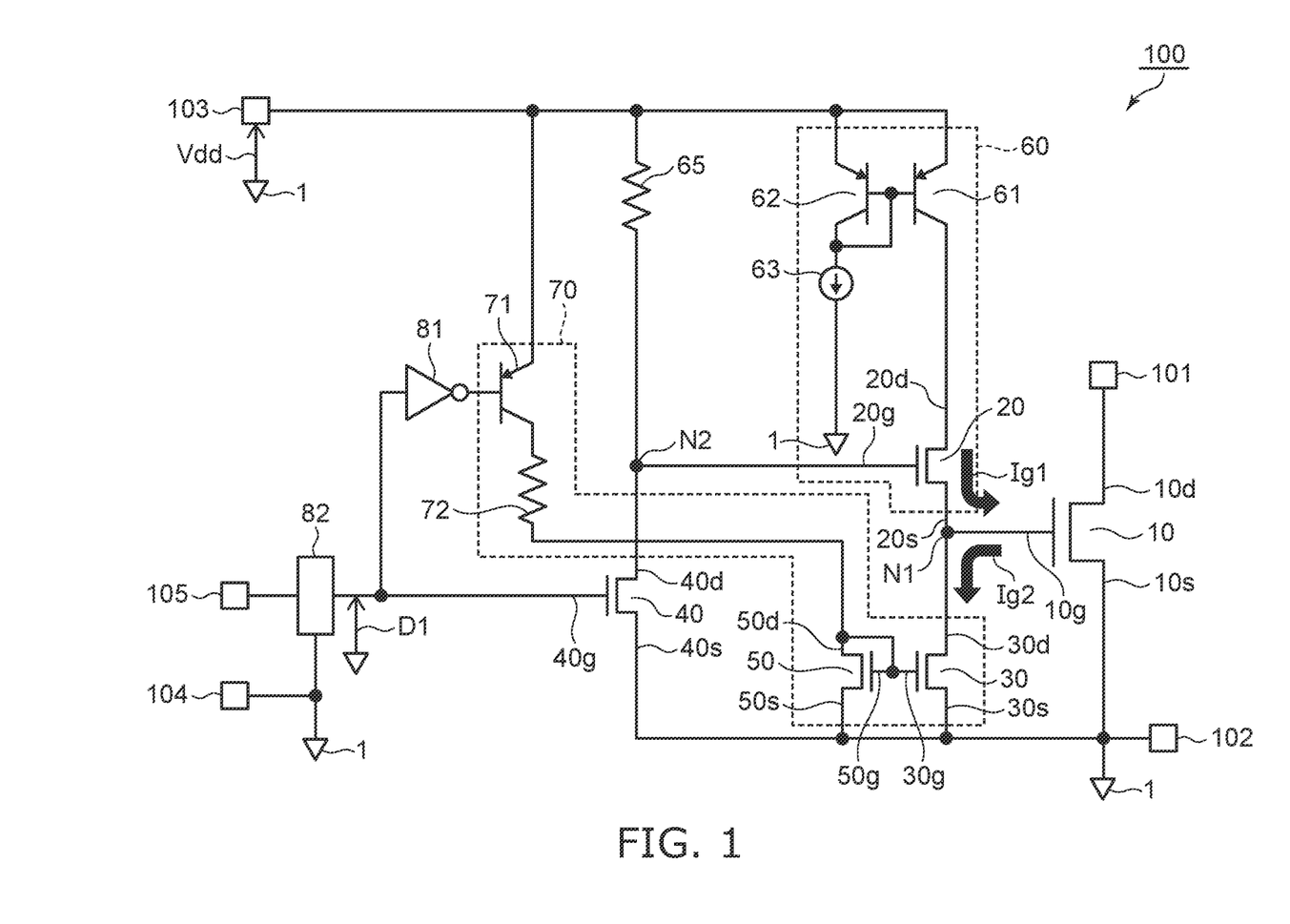
FIG. 1 is a circuit diagram illustrating a semiconductor device according to a first embodiment.

FIG. 1 is a circuit diagram illustrating a semiconductor device according to a first embodiment.

As shown in FIG. 1, the semiconductor device 100 according to the embodiment includes a first transistor 10, a second transistor 20, a third transistor 30, a fourth transistor 40, and a fifth transistor 50. The third transistor 30 and the fifth transistor 50 are included in a current mirror. A resistor 72 that has an adjustable resistance value is connected to the current mirror. The first transistor 10, the second transistor 20, the third transistor 30, the fourth transistor 40, and the fifth transistor 50 include nitride semiconductors and have n-channels.

The first transistor 10, the second transistor 20, the third transistor 30, the fourth transistor 40, and the fifth transistor 50 each are normally-off HEMTs. A normally-off HEMT has a threshold that is a positive voltage value with respect to the source electrode. By applying a voltage greater than the threshold between the gate and source of a normally-off HEMT, a channel that is formed between the drain electrode and the source electrode conducts, and a current flows. By applying a voltage that is not more than the threshold voltage between the gate and source of the normally-off HEMT, the channel between the drain electrode and the source electrode is caused to disappear, and the current that flows between the drain electrode and the source electrode is blocked.

The first transistor 10, the second transistor 20, the third transistor 30, the fourth transistor 40, and the fifth transistor 50 can be normally-off by having a MOS (Metal-Oxide-Semiconductor) structure. In a HEMT having a MOS structure, for example, the drain electrode and the source electrode are located at an AlGaN layer formed on an undoped GaN layer. A portion of the AlGaN layer is removed, an oxide film is formed on the portion, and a gate electrode is provided with the oxide film interposed. A channel is formed under the gate electrode.

The semiconductor device 100 includes a drain electrode pad 101 and a source electrode pad 102. A drain electrode (a first drain electrode) 10d of the first transistor 10 is connected to the drain electrode pad 101. A source electrode (a first source electrode) 10s of the first transistor 10 is connected to the source electrode pad 102. The source electrode pad 102 is electrically connected to a grounding electrode pad (a first electrode pad) 104. The grounding electrode pad 104 is connected to ground; and the voltage (a first voltage) that is applied to a ground 1 is used as the reference voltage of the semiconductor device 100. That is, the voltages of the components of the semiconductor device 100 are referenced to the voltage of the ground 1. The drain electrode 10d of the first transistor 10 is connected to an external circuit via the drain electrode pad 101. The source electrode 10s is connected to the external circuit via the source electrode pad 102. The external circuit is, for example, a load circuit of the first transistor 10. The load circuit of the first transistor 10 is, for example, the primary winding of a transformer.

The second transistor 20 is connected between a power supply electrode pad 103 and the source electrode pad 102. The source electrode (a second source electrode) of the second transistor 20 is connected to a gate electrode 10g of the first transistor 10. The third transistor 30 is connected between the second transistor 20 and the source electrode pad 102. The drain electrode (a third drain electrode) 30d of the third transistor 30 is connected to the gate electrode 10g of the first transistor 10. That is, a connection node N1 between the second transistor 20 and the third transistor 30 is connected to the gate electrode 10*g* of the first transistor 10.

The first transistor 10 is switched on by switching the second transistor 20 on and switching the third transistor 30 off. The first transistor 10 is switched off by switching the second transistor 20 off and switching the third transistor 30 on.

The first transistor 10 is the output stage element of the semiconductor device 100. The second transistor 20 and the third transistor 30 are drive transistors that drive the first transistor 10.

The fourth transistor 40 is connected between the power supply electrode pad 103 and the grounding electrode pad 104. A source electrode 40*s* of the fourth transistor 40 is connected to the grounding electrode pad 104. A drain electrode 40*d* of the fourth transistor 40 is connected to the power supply electrode pad 103 via a resistor 65. A gate electrode 20*g* of the second transistor 20 is connected to a connection node N2 between the resistor 65 and the drain electrode 40*d* of the fourth transistor 40.

The gate of the fourth transistor 40 is connected to the output of a control circuit 82. The fourth transistor 40 is switched on when a signal D1 output by the control circuit 82 is the high level. The fourth transistor 40 is switched off when the signal D1 output by the control circuit 82 is the low level.

The resistor 65 is a pull-up resistor for the second transistor 20. The second transistor 20 is switched off when the fourth transistor 40 is switched on and the voltage of the connection node N2 drops below the threshold of the second transistor 20. The second transistor is switched on when the fourth transistor 40 is switched off and the voltage of the connection node N2 reaches or exceeds the threshold of the second transistor 20.

The fifth transistor 50 is connected between the power supply electrode pad 103 and the source electrode pad 102. A series circuit of a sixth transistor 71 and the resistor 72 is connected between the power supply electrode pad 103 and the fifth transistor 50. A drain electrode 50*d* of the fifth transistor 50 is connected to the resistor 72; and a source electrode 50*s* of the fifth transistor 50 is connected to the source electrode pad 102.

The fifth transistor 50 and the third transistor 30 are included in a current mirror circuit. The source electrode and the gate electrode of the fifth transistor 50 are connected respectively to the source electrode and the gate electrode of the third transistor 30. The gate electrode and the drain electrode of the fifth transistor 50 are connected to each other.

By setting the ratio of the transistor sizes of the third and fifth transistors 30 and 50, the current that flows between the drain and the source of the third transistor 30 can be set to the current value of the current flowing between the drain and the source of the fifth transistor 50 multiplied by the gate width ratio. The transistor size is represented by a gate width W to a gate length L (W/L) of each transistor. For a certain gate length L, the ratio of the transistor sizes of the two transistors is the ratio of the gate widths W of the two transistors.

The sixth transistor 71 is, for example, a p-n-p transistor formed by a Si bipolar process. The sixth transistor 71 is not limited to a bipolar transistor and may be a p-ch MOSFET formed by a Si process.

The third transistor 30, the fifth transistor 50, the sixth transistor 71, and the resistor 72 are included in a gate discharge circuit (a second drive circuit) 70. The gate discharge circuit 70 sets a gate discharge current (a second drive current) Ig2 output to the gate electrode 10*g* of the first transistor 10. The gate discharge current Ig2 flows from the gate electrode 10*g* of the first transistor 10 toward the drain electrode 30*d* of the third transistor 30. When a power supply voltage Vdd is constant, the current value of the gate discharge current Ig2 can be set by setting the resistance value of the resistor 72. The current value of the gate discharge current Ig2 can be adjusted by adjusting the resistance value of the resistor 72.

A seventh transistor 61 is connected between the power supply electrode pad 103 and the second transistor 20. The emitter electrode of the seventh transistor 61 is connected to the power supply electrode pad 103. The collector electrode of the seventh transistor 61 is connected to a drain electrode 20*d* of the second transistor 20.

An eighth transistor 62 is connected between the power supply electrode pad 103 and the grounding electrode pad 104. A constant current source 63 is connected between the eighth transistor 62 and the grounding electrode pad 104. The emitter electrode of the eighth transistor 62 is connected to the power supply electrode pad 103.

For example, the seventh transistor 61 and the eighth transistor 62 each are p-n-p transistors formed by a Si bipolar process. The seventh transistor 61 and the eighth transistor 62 are not limited to bipolar transistors and may be p-ch MOSFETs formed by a Si process. The constant current source 63 also is formed by the same Si process as the seventh and eighth transistors 61 and 62.

The seventh transistor 61 and the eighth transistor 62 are included in a current mirror circuit. The emitter electrode and base electrode of the seventh transistor 61 are connected respectively to the emitter electrode and base electrode of the eighth transistor 62. The collector electrode of the eighth transistor 62 is connected to the base electrode. The constant current source 63 is connected between the source electrode pad 102 and the collector electrode of the eighth transistor 62. Accordingly, the seventh transistor 61 outputs a current that is the ratio of the emitter area of the eighth transistor 62 and the emitter area of the seventh transistor 61 multiplied by the output current value of the constant current source 63. The current that is output from the seventh transistor 61 is output as a gate charge current (a first drive current) Ig1 by the second transistor 20. The gate charge current Ig1 flows from a source electrode 20*s* of the second transistor 20 toward the gate electrode 10*g* of the first transistor 10.

The constant current source 63 is, for example, a series circuit of a bandgap circuit and a resistor and can set the current value that is output by setting the resistance value of the resistor. The second transistor 20, the seventh transistor 61, the eighth transistor 62, and the constant current source 63 are included in a gate charge circuit (a first drive circuit) 60. In the gate charge circuit 60, the current value of the gate charge current Ig1 output by the second transistor 20 can be adjusted by adjusting the current value output by the constant current source 63.

In the example, the input of the control circuit 82 is connected to one input electrode pad 105. In the example, the output of the control circuit 82 is connected to the gate electrode of the fourth transistor 40 and the input of an inverter circuit 81. The control circuit 82 can have any appropriate circuit function and can have, for example, a level shift function as in the example. In such a case, the voltage level between the input electrode pad 105 and the grounding electrode pad 104 is converted into a voltage level that drives the fourth transistor 40 and the sixth transistor 71 and is output by the control circuit 82. The control circuit 82 may be a PWM control circuit, etc.

Operations of the semiconductor device 100 according to the embodiment will now be described.

The first transistor 10 is switched by the on and off of the second and third transistors 20 and 30 that are drive transistors. The power supply voltage Vdd that is sufficiently greater than the thresholds of the first transistor 10, the second transistor 20, the third transistor 30, the fourth transistor 40, and the fifth transistor 50 is applied between the power supply electrode pad 103 and the grounding electrode pad 104. The power supply voltage Vdd is, for example, +15 V. The signal D1 which is the output signal of the control circuit 82 has a high level voltage value and a low level voltage value. The high level voltage value of the signal D1 is sufficiently greater than the threshold of the fourth transistor 40; and the low level voltage value is sufficiently less than the threshold of the fourth transistor 40.

First, the operation when the first transistor 10 is switched on will be described.

The control circuit 82 outputs the signal D1 of the low level. The fourth transistor 40 is switched off by the low level voltage value of the signal D1. By switching the fourth transistor 40 off, the connection node N2 is pulled up to the power supply voltage Vdd via the resistor 65.

The second transistor 20 is switched on by the connection node N2 being pulled up to the power supply voltage Vdd that is greater than the threshold of the second transistor 20.

The drain electrode 20d of the second transistor 20 is connected to the collector electrode of the seventh transistor 61 that is the output of the current mirror. Therefore, the second transistor 20 outputs the gate charge current Ig1 that is the current value output by the constant current source 63 multiplied by the emitter area ratio of the seventh transistor 61 and the eighth transistor 62.

The gate charge current Ig1 that is output by the second transistor 20 charges the parasitic capacitance that includes the Miller capacitance of the first transistor 10. The first transistor is switched on by the charging of the parasitic capacitance. The current value of the gate charge current Ig1 determines the charging time of the parasitic capacitance of the first transistor and determines the turn-on time of the first transistor 10.

On the other hand, the sixth transistor 71 is switched off by the signal D1. Accordingly, a current does not flow in the resistor 72; and the gate discharge circuit 70 is blocked. That is, the gate discharge current Ig2 that is output by the third transistor 30 is substantially 0. Accordingly, the on-state of the first transistor 10 is maintained.

The operation when the first transistor 10 is switched off will now be described.

The control circuit 82 outputs the signal D1 of the high level. The fourth transistor 40 is switched on by the high level voltage of the signal D1. The voltage of the connection node N2 is set to be substantially equal to the ground potential by the fourth transistor 40 being switched on. Accordingly, the second transistor 20 is off, and the gate charge current Ig1 that is output by the second transistor 20 is substantially 0.

The sixth transistor 71 is switched on by the signal D1 of the high level of the control circuit 82. Therefore, the current that flows in the fifth transistor 50 is determined by the power supply voltage Vdd and the resistance value of the resistor 72; and the current output by the third transistor 30 included in the current mirror is determined. That is, by switching the sixth transistor 71 on, the gate discharge circuit 70 outputs the gate discharge current Ig2 that has a current value proportional to the current value determined by the power supply voltage Vdd and the resistance value of the resistor 72.

The third transistor 30 outputs the gate discharge current Ig2 and discharges the parasitic capacitance that includes the Miller capacitance of the gate of the first transistor 10. Due to the discharge of the parasitic capacitance of the first transistor 10, the gate-source voltage drops, and the first transistor 10 is switched off.

Thus, the first transistor 10 is turned on by the gate charge current Ig1 having a current value set by the gate charge circuit 60. The first transistor 10 is turned off by the gate discharge current Ig2 having the current value set by the gate discharge circuit 70.

A specific configuration example of the semiconductor device 100 according to the embodiment will now be described.

Figure 2:
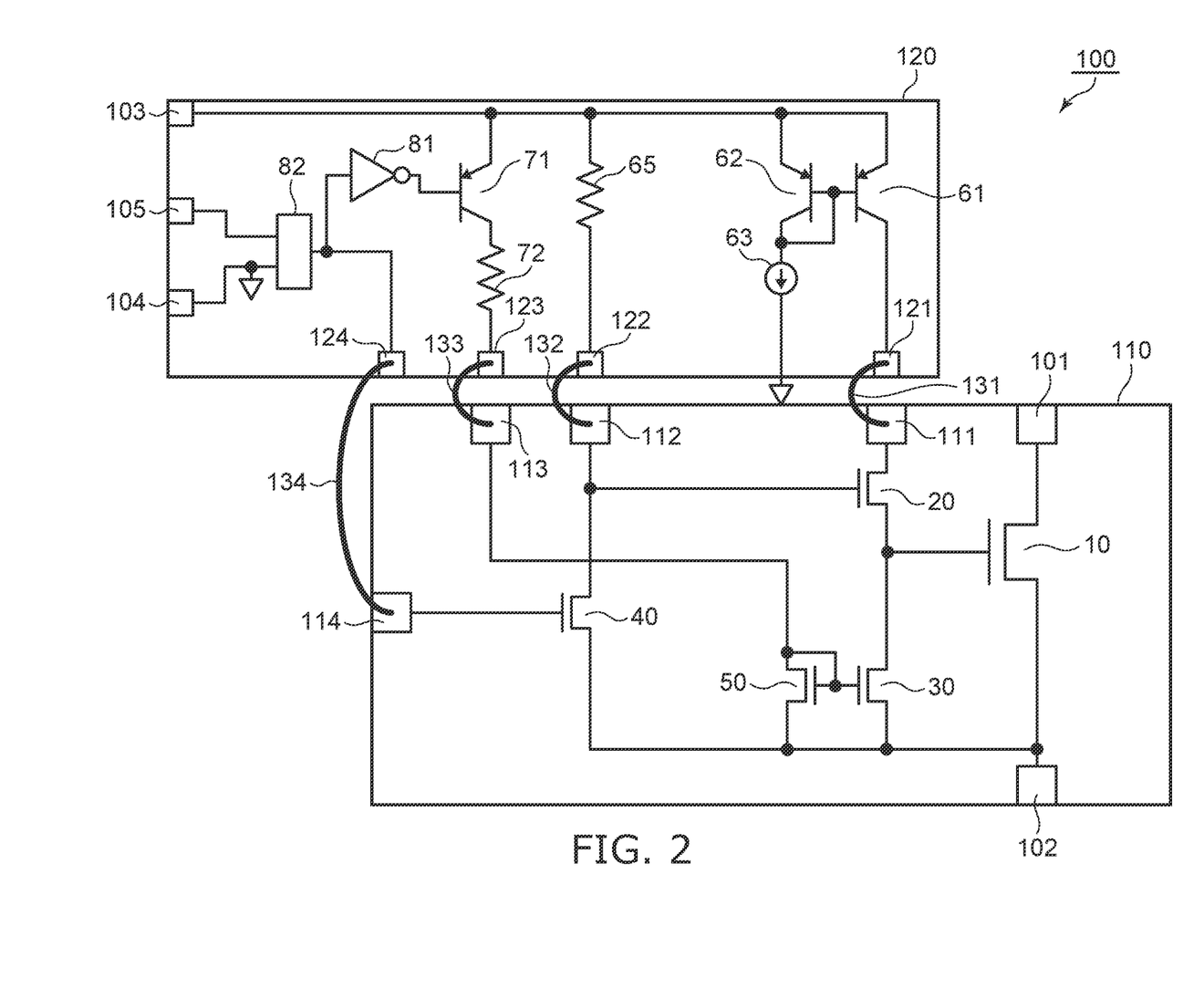
FIG. 2 is a schematic view illustrating the semiconductor device according to the first embodiment.

FIG. 2 is a schematic view illustrating the semiconductor device according to the first embodiment.

As shown in FIG. 2, the semiconductor device 100 includes an output circuit 110 and a control circuit 120. The output circuit 110 includes the first transistor 10, the second transistor 20, the third transistor 30, the fourth transistor 40, and the fifth transistor 50.

As described above, the first transistor 10, the second transistor 20, the third transistor 30, the fourth transistor 40, and the fifth transistor 50 include nitride semiconductors and formed on, for example, the same GaN substrate.

The control circuit 120 includes the sixth transistor 71, the seventh transistor 61, the eighth transistor 62, the constant current source 63, the resistor 72, the resistor 65, the inverter circuit 81, and the control circuit 82. For example, the sixth transistor 71, the seventh transistor 61, the eighth transistor 62, the constant current source 63, the resistor 72, the resistor 65, the inverter circuit 81, and the control circuit 82 are formed on the same Si substrate.

Thus, the semiconductor device 100 according to the embodiment includes the output circuit 110 formed on a GaN substrate, and the control circuit 120 formed on a Si substrate. The output circuit 110 includes the drain electrode pad 101 and the source electrode pad 102 on the GaN substrate. The output circuit 110 also includes a first interconnection pad 111, a second interconnection pad 112, a third interconnection pad 113, and a fourth interconnection pad 114 on the GaN substrate.

The first interconnection pad 111 is connected to the drain of the second transistor 20 by wiring formed on the GaN substrate. The second interconnection pad 112 is connected to the gate of the second transistor 20 and the drain of the fourth transistor 40 by wiring formed on the GaN substrate. The third interconnection pad 113 is connected to the drain of the fifth transistor 50 by wiring formed on the GaN substrate. The fourth interconnection pad 114 is connected to the gate of the fourth transistor 40 by wiring formed on the GaN substrate.

Other than the power supply electrode pad 103, the grounding electrode pad 104, and the input electrode pad 105 formed on the Si substrate, the control circuit 120 includes a fifth interconnection pad 121, a sixth interconnection pad 122, a seventh interconnection pad 123, and an eighth interconnection pad 124.

The fifth interconnection pad 121 is connected to the collector of the seventh transistor 61 by wiring formed on the Si substrate. The sixth interconnection pad 122 is connected to the constant current source 63 by wiring formed on the Si substrate. The seventh interconnection pad 123 is connected to the resistor 65 by wiring formed on the Si substrate. The eighth interconnection pad 124 is connected to the output of the control circuit 82 and the input of the inverter circuit 81 by wiring formed on the Si substrate.

The first interconnection pad 111 and the fifth interconnection pad 121 are connected to each other by a first interconnection wire (a first connection wire) 131. The second interconnection pad 112 and the sixth interconnection pad 122 are connected to each other by a second interconnection wire 132. The third interconnection pad 113 and the seventh interconnection pad 123 are connected to each other by a third interconnection wire 133. The fourth interconnection pad 114 and the eighth interconnection pad 124 are connected to each other by a fourth interconnection wire 134.

The first interconnection wire 131, the second interconnection wire 132, the third interconnection wire 133, and the fourth interconnection wire 134 are conductive members that include Au, Cu, etc. The semiconductor device 100 is formed by connecting the output circuit 110 and the control circuit 120 to each other by the first interconnection wire 131, the second interconnection wire 132, the third interconnection wire 133, and the fourth interconnection wire 134. For example, the semiconductor device 100 includes the output circuit 110 and the control circuit 120 housed in the same package.

Effects of the semiconductor device 100 according to the embodiment will now be described.

In the semiconductor device 100 according to the embodiment, the gate charge current Ig1 for switching the first transistor on can be set by setting the current value of the gate charge circuit 60. The gate charge current Ig1 charges the parasitic capacitance between the gate and source of the first transistor 10. Accordingly, the turn-on time of the first transistor can be adjusted by the gate charge circuit 60 adjusting the current value of the gate charge current Ig1.

In the semiconductor device 100 according to the embodiment, the gate discharge current Ig2 for switching the first transistor 10 off can be set by setting the current value of the gate discharge circuit 70. The gate discharge current Ig2 discharges the parasitic capacitance between the gate and source of the first transistor 10. Accordingly, the turn-off time of the first transistor 10 can be adjusted by adjusting the current value of the gate discharge current Ig2 by the gate discharge circuit 70.

In a semiconductor device that includes an output stage, there are many cases where it is favorable for the turn-on time and the turn-off time of a transistor included in the output stage to be fast to reduce the switching loss. On the other hand, when the turn-on time and the turn-off time are fast, the rise and the fall of the drain-source voltage become steep, and an excessive surge voltage and/or reverse voltage may be applied between the drain and the source. Also, when the turn-on time and the turn-off time are fast, the temporal change of the drain current may be increased, causing conduction noise, radiation noise, etc. Therefore, there are many cases where it is desirable to adjust the turn-on time and/or turn-off time of the transistor of the output stage while considering the magnitude of the switching loss, the occurrence state of the surge voltage, etc.

In the semiconductor device 100 according to the embodiment, the turn-on time and the turn-off time of the first transistor 10 can be adjusted by adjusting the output current value of the drive circuit. Accordingly, the occurrence of surges, noise, etc., can be suppressed while reducing the magnitude of the switching loss of the semiconductor device 100.

In the semiconductor device 100 of the embodiment, the first to fifth transistors 10 to 50 are formed in the same substrate including GaN. Therefore, the physical distance between the first transistor 10, which is the output stage element, and the second and third transistors 20 and 30 included in the drive circuits can be minimized. Therefore, a sufficiently fast turn-on time and turn-off time can be realized while suppressing vibrations, oscillations, etc., of the waveform caused by the parasitic inductance of the wiring connecting these transistors.

Second Embodiment

Figure 3:
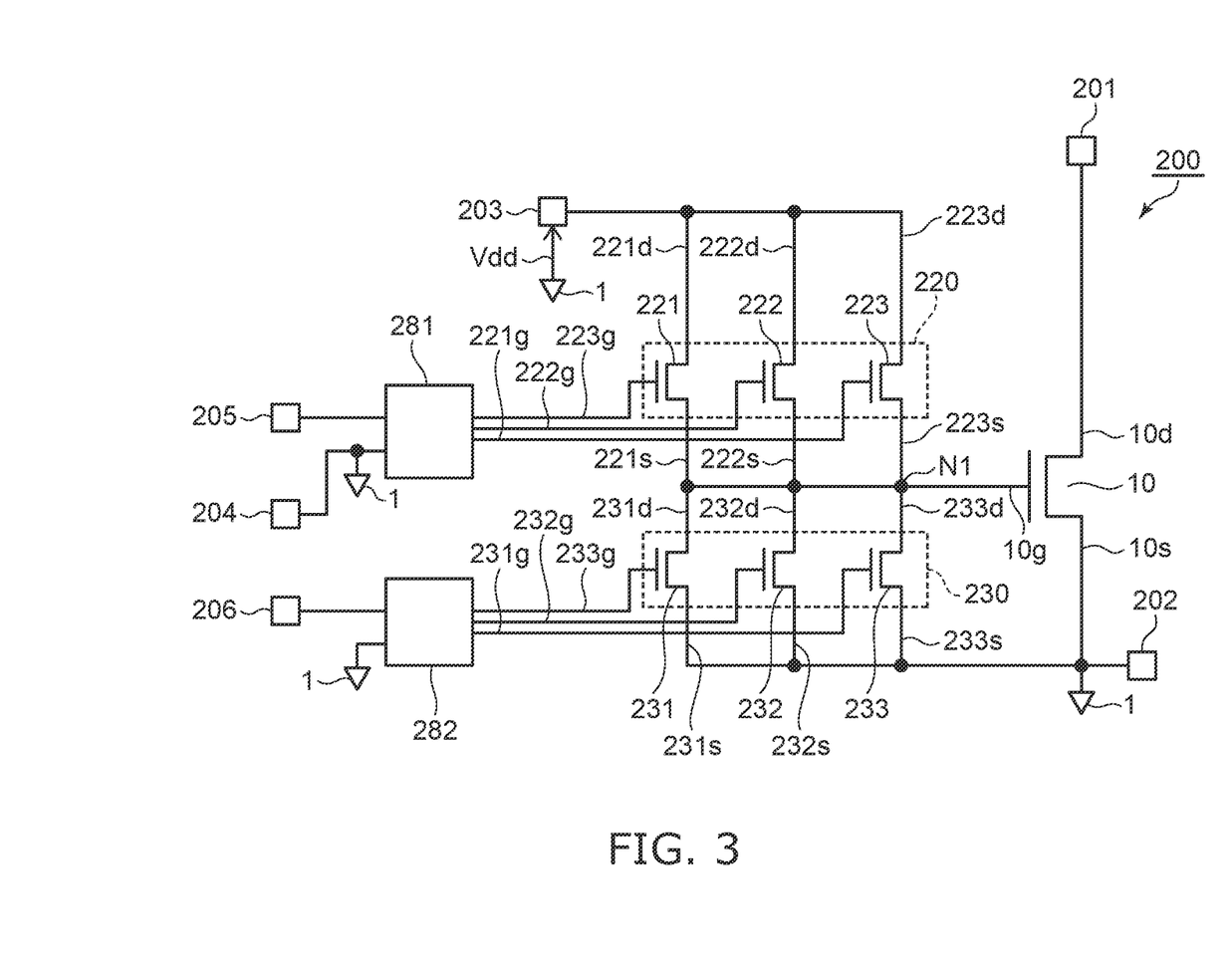
FIG. 3 is a circuit diagram illustrating a semiconductor device according to a second embodiment.

FIG. 3 is a circuit diagram illustrating a semiconductor device according to a second embodiment.

As shown in FIG. 3, the semiconductor device 200 according to the embodiment includes the first transistor 10, a first drive circuit 220, and a second drive circuit 230. The first transistor 10 has the same configuration as the first transistor 10 according to the first embodiment, and is marked with the same reference numerals; and a detailed description is omitted as appropriate.

The drain electrode 10d of the first transistor 10 is connected to a drain electrode pad 201. The source electrode 10s of the first transistor 10 is connected to a source electrode pad 202. The source electrode pad 202 is connected to a grounding electrode pad 204 and is connected to ground together with the grounding electrode pad 204. The drain electrode pad 201 and the source electrode pad 202 are connected to an external circuit such as the primary winding of a transformer, etc.

The first drive circuit 220 includes a first drive transistor (the second transistor) 221, a second drive transistor 222, and a third drive transistor 223. The first drive transistor 221, the second drive transistor 222, and the third drive transistor 223 are connected in parallel. That is, drain electrodes 221d to 223d of the three drive transistors are connected to each other; and source electrodes 221s to 223s of the three drive transistors are connected to each other.

The drain electrodes 221d to 223d of the three drive transistors are connected to a power supply electrode pad 203. The source electrodes 221s to 223s of the three drive transistors are connected to the gate electrode 10g of the first transistor 10. The power supply voltage Vdd is applied between the power supply electrode pad 203 and the grounding electrode pad 204. The power supply voltage Vdd is a DC voltage that is positive when referenced to the voltage applied to the ground 1 to which the grounding electrode pad 204 is connected.

The second drive circuit 230 includes a fourth drive transistor 231, a fifth drive transistor 232, and a sixth drive transistor 233. The fourth drive transistor 231, the fifth drive transistor 232, and the sixth drive transistor 233 are connected in parallel. That is, drain electrodes 231d to 233d of the three drive transistors are connected to each other; and source electrodes 231s to 233s of the three drive transistors are connected to each other.

The drain electrodes 231d to 233d of the three drive transistors are connected to the gate electrode 10g of the first transistor 10. The source electrodes 231s to 233s of the three drive transistors are connected to the source electrode pad 202. That is, the first drive circuit 220 and the second drive circuit 230 are connected in series between the power supply electrode pad 203 and the grounding electrode pad 204. The connection node N1 between the first drive circuit 220 and the second drive circuit 230 is connected to the gate electrode 10g of the first transistor 10.

For example, the first drive transistor 221, the second drive transistor 222, and the third drive transistor 223 have substantially the same transistor size. Therefore, the driving capabilities of the first drive transistor 221, the second drive transistor 222, and the third drive transistor 223 are substantially the same.

For example, the fourth drive transistor 231, the fifth drive transistor 232, and the sixth drive transistor 233 have substantially the same transistor size. Therefore, the driving capabilities of the fourth drive transistor 231, the fifth drive transistor 232, and the sixth drive transistor 233 are substantially the same.

The driving capabilities of the multiple drive transistors being the same means that the magnitude of the current flowing between the drain and the source is the same when the same drain-source voltage and the same gate-source voltage are applied to the multiple drive transistors. The first drive transistor 221, the second drive transistor 222, and the third drive transistor 223 are connected in parallel. Therefore, by applying the same gate-source voltage to the drive transistors, the currents that flow between the drain and the source are caused to be substantially the same. The fourth drive transistor 231, the fifth drive transistor 232, and the sixth drive transistor 233 are connected in parallel. Therefore, by applying the same gate-source voltage to the drive transistors, the currents that flow between the drain and the source of the drive transistors are caused to be substantially the same.

The transistor sizes of the first to sixth drive transistors 221 to 233 can be substantially the same. The transistor sizes are not limited thereto; for example, transistor sizes of the multiple drive transistors of the first drive circuit 220 may be different from the transistor sizes of the multiple drive transistors included in the second drive circuit 230.

Although the number of drive transistors included in the first drive circuit 220 is three as described above, the number of drive transistors may be two, four, or more. The number of drive transistors included in the second drive circuit 230 is not limited to three and may be one, two, four, or more.

Although the first drive circuit 220 includes three drive transistors and the second drive circuit 230 includes three drive transistors, i.e., the same number as the number of drive transistors of the first drive circuit as described above, the configuration is not limited to having the same number of transistors. The number of drive transistors of the first drive circuit 220 and the number of drive transistors of the second drive circuit 230 may be different from each other.

Although the transistor sizes of the multiple drive transistors of the first drive circuit 220 are all the same, the transistor sizes are not limited to being the same. For example, the ratio of the transistor sizes of the first drive transistor 221, the second drive transistor 222, and the third drive transistor 223 may be 1:2:4.

The transistor sizes of the multiple drive transistors of the second drive circuit 230 may be different from each other.

Similarly to the first transistor, the first to sixth drive transistors 221 to 233 include nitride semiconductors and are normally-off MOS HEMTs having n-channels. For example, the first transistor 10 and the first to sixth drive transistors 221 to 233 are formed in the same GaN substrate.

An input of a first control circuit 281 is connected to a first input electrode pad 205. A control signal is input to the first control circuit 281 via the first input electrode pad 205. In the example, the first control circuit 281 is connected to the grounding electrode pad 204. The grounding electrode pad 204 is connected to the ground 1 to which the reference voltage is applied and is connected to the source electrode pad 202 via the ground 1. The grounding electrode pad 204 is connected to the ground 1 of a second control circuit 282.

The output of the first control circuit 281 is connected to a gate electrode 221g of the first drive transistor 221, a gate electrode 222g of the second drive transistor 222, and a gate electrode 223g of the third drive transistor 223. For example, the first control circuit 281 drives the gate electrode of at least one drive transistor among the first drive transistor 221, the second drive transistor 222, and the third drive transistor 223 according to the control signal.

The first control circuit 281 selectively drives the gate electrode 221g of the first drive transistor 221, the gate electrode 222g of the second drive transistor 222, and the gate electrode 223g of the third drive transistor 223. For example, the first control circuit 281 drives the gate electrode 221g of the first drive transistor 221 but does not drive the gate electrodes of the other drive transistors. For example, the first control circuit 281 simultaneously drives the gate electrode 221g of the first drive transistor 221 and the gate electrode 222g of the second drive transistor 222 but does not drive the gate electrode of the other drive transistor. For example, the first control circuit 281 simultaneously drives the gate electrodes 221g to 223g of all of the drive transistors.

The input of the second control circuit 282 is connected to a second input electrode pad 206. A control signal is input to the second control circuit 282 via the second input electrode pad 206.

The output of the second control circuit 282 is connected to a gate electrode 231g of the fourth drive transistor 231, a gate electrode 232g of the fifth drive transistor 232, and a gate electrode 233g of the sixth drive transistor 233. The second control circuit 282 selectively drives the gate electrode 231g of the fourth drive transistor 231, the gate electrode 232g of the fifth drive transistor 232, and the gate electrode 233g of the sixth drive transistor 233. For example, the second control circuit 282 drives the gate electrode 231g of the fourth drive transistor 231 but does not drive the gates of the other drive transistors. For example, the second control circuit 282 simultaneously drives the gate electrode 231g of the fourth drive transistor 231 and the gate electrode 232g of the fifth drive transistor 232 but does not drive the gate of the other drive transistor. For example, the second control circuit 282 simultaneously drives the gate electrodes 231g to 233g of all of the drive transistors.

For example, the first control circuit 281 and the second control circuit 282 generate complimentary drive signals based on the control signals input to the first and second control circuits 281 and 282. To generate complimentary drive signals means that, for example, the second control circuit 282 generates a low-level drive signal when the first control circuit 281 generates a high-level drive signal. It also means that the first control circuit 281 generates a low-level drive signal when the second control circuit 282 generates a high-level drive signal.

For example, the gate electrodes of the drive transistors that are driven by the first and second drive circuits 220 and 230 are preset. Or, the gate electrodes of the drive transistors that are driven by the first and second drive circuits 220 and 230 can be selected and adjusted. For example, the selection of the gate electrodes of the drive transistors that are driven by the first and second drive circuits 220 and 230 may be switched according to the operation mode of the semiconductor device 200. The operation mode of the semiconductor device 200 is the operation mode when the load of the power conversion device using the semiconductor device 200 as a circuit component is low, the operation mode when the load is high, etc.

Operations of the semiconductor device 200 according to the embodiment will now be described.

First, an operation when the first transistor 10 is switched on will be described.

The first control circuit 281 generates a high-level drive signal. The first control circuit 281 selects the necessary number of drive transistors from the multiple drive transistors and simultaneously drives the gate electrodes of the selected drive transistors.

The first drive circuit 220 outputs the gate charge current Ig1 corresponding to the number of selected drive transistors and charges the parasitic capacitance including the Miller capacitance between the gate and source of the first transistor 10 by the gate charge current Ig1. The first transistor 10 is switched on by the voltage between the gate and source of the first transistor 10 rising and exceeding the threshold of the first transistor 10 due to the output of the gate charge current Ig1.

At this time, the second control circuit 282 generates a low-level drive signal. Accordingly, the output of the second drive circuit 230 has high impedance. Therefore, the voltage of the connection node N1 is determined by the output of the first drive circuit 220. The on-state of the first transistor 10 is continued.

An operation when switching the first transistor 10 off will now be described.

The second control circuit 282 generates a high-level drive signal. The second control circuit 282 selects the necessary number of drive transistors from the multiple drive transistors and simultaneously drives the gate electrodes of the selected drive transistors.

The second drive circuit 230 outputs the gate discharge current Ig2 corresponding to the number of selected drive transistors and discharges the parasitic capacitance including the Miller capacitance between the gate and source of the first transistor 10 by the gate discharge current Ig2. The first transistor 10 is switched off by the voltage between the gate and source of the first transistor 10 dropping and falling below the threshold of the first transistor 10 due to the output of the gate discharge current Ig2.

At this time, the first control circuit 281 generates the low-level drive signal. Accordingly, the output of the first drive circuit 220 has high impedance. Therefore, the voltage of the connection node N1 is determined by the output of the second drive circuit 230. The off-state of the first transistor 10 is continued.

The first control circuit 281 selects the necessary drive transistors from the multiple drive transistors of the first drive circuit 220 and sets the current value of the gate charge current Ig1 corresponding to the number of selected drive transistors. By setting the current value of the gate charge current Ig1, the turn-on time of the first transistor 10 can be appropriately set.

The second control circuit 282 selects the necessary drive transistors from the multiple drive transistors of the second drive circuit 230 and sets the current value of the gate discharge current Ig2 corresponding to the number of selected drive transistors. By setting the current value of the gate discharge current Ig2, the turn-off time of the first transistor 10 can be appropriately set.

Effects of the semiconductor device 200 according to the embodiment will now be described.

The semiconductor device 200 according to the embodiment includes the first drive circuit 220 that switches the first transistor 10 on. The first drive circuit 220 includes multiple drive transistors connected in parallel. The first control circuit 281 selectively and simultaneously drives at least one drive transistor from the multiple drive transistors. The current value of the gate charge current Ig1 can be adjusted using the total driving capability of the selected drive transistors. The gate charge current Ig1 is the charge current of the parasitic capacitance for turning on the first transistor 10. The turn-on time of the first transistor 10 decreases as the current value of the gate charge current Ig1 increases; and the turn-on time of the first transistor 10 increases as the current value of the gate charge current Ig1 decreases. Accordingly, the first control circuit 281 can adjust the current value of the gate charge current Ig1 that is output by selecting the drive transistors that are simultaneously driven from the multiple drive transistors. Accordingly, the first transistor 10 is turned on in the desired turn-on time.

The semiconductor device 200 according to the embodiment includes the second drive circuit 230 that switches the first transistor 10 off. The second drive circuit 230 includes multiple drive transistors connected in parallel. The second control circuit 282 selectively and simultaneously drives at least one drive transistor from the multiple drive transistors. The current value of the gate discharge current Ig2 can be adjusted by the driving capability of the selected drive transistors. The gate discharge current Ig2 is a discharge current for turning off the first transistor 10. The turn-off time of the first transistor 10 decreases as the current value of the gate discharge current Ig2 increases. The turn-off time of the first transistor 10 increases as the current value of the gate discharge current Ig2 decreases. Accordingly, the second control circuit 282 can adjust the current value of the gate discharge current Ig2 that is output by selecting the drive transistors that are simultaneously driven from the multiple drive transistors. Accordingly, the first transistor 10 is turned off in the desired turn-off time.

As described in the first embodiment, the switching loss can be reduced by reducing either the turn-on time or the turn-off time of the first transistor 10, but a surge voltage, noise, etc., may occur. In the semiconductor device 200 according to the embodiment as well, by adjusting the gate charge current Ig1 and the gate discharge current Ig2, both the reduction of the switching loss and problems such as surge voltage generation, etc., can be appropriately improved.

In the semiconductor device 200 according to the embodiment, because the selection state of the drive transistors can be modified in the operation of the semiconductor device 200, for example, the gate charge current Ig1 and the gate discharge current Ig2 can be modified according to the operation mode of the power conversion circuit to which the semiconductor device 200 is applied. Therefore, operations at the optimal conditions can be realized by realizing the improvement of both the reduction of the switching loss and problems such as surge voltage generation, etc., in each operation mode.

In the semiconductor device 200 according to the embodiment, each of the first transistor 10, the first drive circuit 220, and the second drive circuit 230 can have transistor structures that include nitride semiconductors. For example, the first transistor 10, the first drive circuit 220, and the second drive circuit 230 can be formed on the same GaN substrate; and the electrical connections between the transistors can be minimized. Therefore, effects of the parasitic inductance of the wiring and the like on the first and second drive circuits 220 and 230 can be minimized, and the gate charge current Ig1 and the gate discharge current Ig2 of sufficient magnitudes can be output to the first transistor 10.

Third Embodiment

Figure 4:
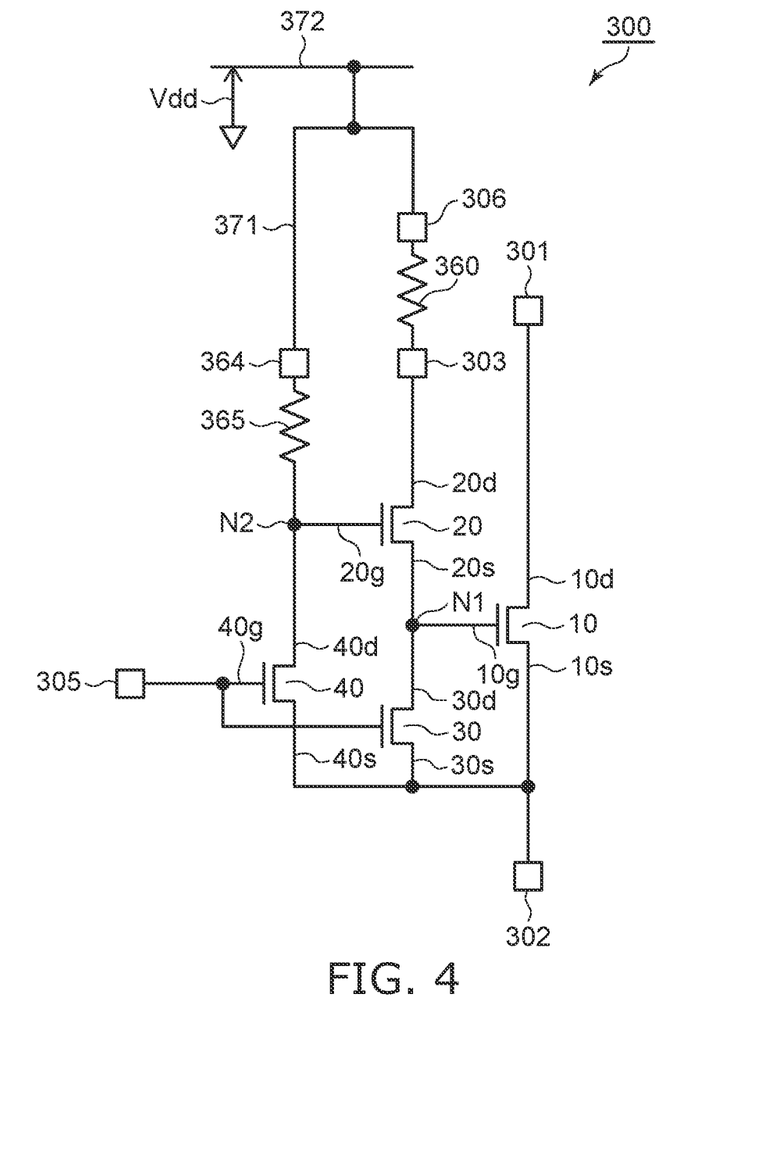
FIG. 4 is a circuit diagram illustrating a semiconductor device according to a third embodiment.

FIG. 4 is a circuit diagram illustrating a semiconductor device according to a third embodiment.

As shown in FIG. 4, the semiconductor device 300 according to the embodiment includes the first transistor 10, the second transistor 20, the third transistor 30, the fourth transistor 40, and a resistor 360.

The first to fourth transistors 10 to 40 can have the same configurations as those of the first embodiment and are formed in, for example, the same GaN substrate. A drain electrode pad 301 is connected to the drain electrode 10d of the first transistor 10. A source electrode pad 302 is connected to the source electrode 10s of the first transistor 10. The drain electrode pad 301 and the source electrode pad 302 are connected to an external circuit such as the primary winding of a transformer, etc.

In the semiconductor device 300 according to the embodiment, a first power supply electrode pad 303 is connected to the drain electrode 20d of the second transistor 20. The source electrode 20s of the second transistor 20 is connected to the gate electrode 10g of the first transistor 10.

The drain electrode 30d of the third transistor 30 is connected to the source electrode 20s of the second transistor and the gate electrode 10g of the first transistor 10. That is, the connection node N1 between the second transistor 20 and the third transistor 30 is connected to the gate electrode 10g of the first transistor 10.

The drain electrode 40d of the fourth transistor 40 is connected to a second power supply electrode pad 304 via a resistor 365. The source electrode 40s of the fourth transistor is connected to the source electrode pad 302. A gate electrode 40g of the fourth transistor 40 and a gate electrode 30g of the third transistor 30 are connected to a gate electrode pad 305.

The semiconductor device 300 includes a third power supply electrode pad 306; and the resistor 360 is connected between the first power supply electrode pad 303 and the third power supply electrode pad 306. The semiconductor device 300 includes wiring 371 connecting the second power supply electrode pad 304 and the third power supply electrode pad 306. The wiring 371 is connected to a power supply line 372. The power supply voltage Vdd is a positive DC voltage when referenced to the voltage applied to the source electrode pad 302 and is applied between the power supply line 372 and the source electrode pad 302.

Figure 5:
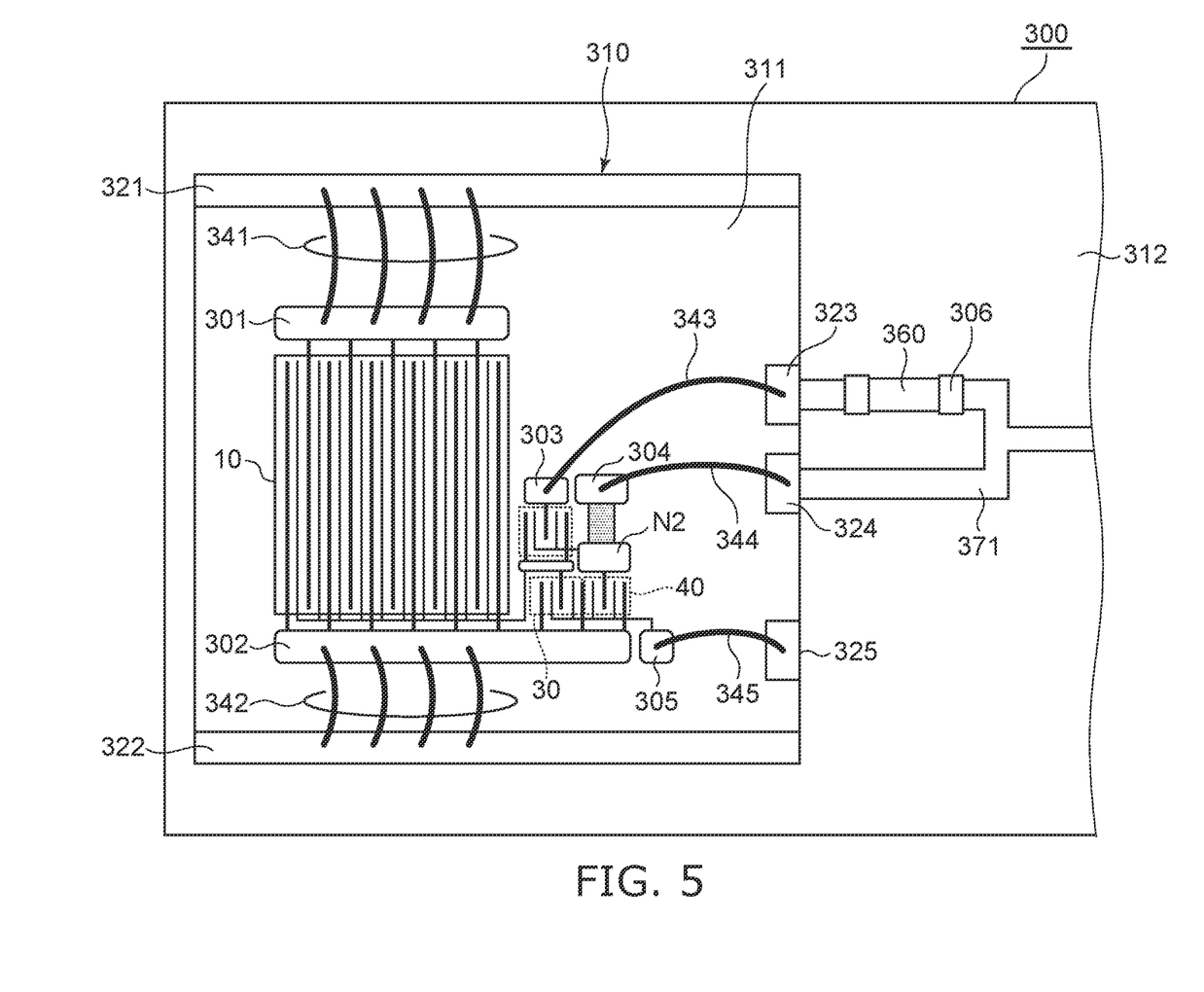
FIG. 5 is a schematic view illustrating the semiconductor device according to the third embodiment.

FIG. 5 is a schematic view illustrating the semiconductor device according to the third embodiment.

As shown in FIG. 5, for example, the semiconductor device 300 according to the embodiment is formed on a substrate 311.

An output circuit 310 includes the first transistor 10, the second transistor 20, the third transistor 30, the fourth transistor 40, and the resistor 365. For example, the output circuit 310 is located on the substrate 311 that includes AlN or the like and has good heat dissipation. A drain external connection pad 321, a source external connection pad 322, a first power supply external connection pad 323, a second power supply external connection pad 324, and a gate external connection pad 325 are formed in the substrate 311.

In the output circuit 310, the drain electrode pad 301 and the drain external connection pad 321 are connected to each other by a drain connection wire 341. The source electrode pad 302 and the source external connection pad 322 are connected to each other by a source connection wire 342. The first power supply electrode pad 303 and the first power supply external connection pad 323 are connected to each other by a first power supply connection wire 343. The second power supply electrode pad 304 and the second power supply external connection pad 324 are connected to each other by a second power supply connection wire 344. The gate electrode pad 305 and the gate external connection pad 325 are connected to each other by a gate connection wire 345. Each connection wire is formed of a conductive material including Au, Cu, etc.

For example, the output circuit 310 is located in a substrate 312 with the substrate 311 interposed, and the substrate 312 is different from the substrate 311. The wiring 371 is formed on the substrate 312; and the third power supply electrode pad 306 is formed in a portion of the wiring 371. The resistor 360 is located between the first power supply external connection pad 323 and the third power supply electrode pad 306 and electrically connected to the first power supply external connection pad 323 and the third power supply electrode pad 306. The wiring 371 is connected to a not-illustrated power supply line on the substrate 312. The power supply voltage Vdd is applied between the power supply line and the source electrode pad 302.

The resistor 360 is, for example, a chip resistor and can be detachable. For example, a chip resistor that has the appropriate resistance value can be connected as the resistor 360 while checking the operation of the semiconductor device 300.

Operations of the semiconductor device 300 according to the embodiment will now be described.

Similarly to the first embodiment, the first transistor 10 is an output stage element; and the second transistor 20 and the third transistor 30 are included in drive circuits that drive the first transistor 10.

An operation when the first transistor 10 is switched on will now be described.

A drive signal is input between the gate electrode pad 305 and the source electrode pad 302. The drive signal includes a high level voltage and a low level voltage. The fourth transistor is switched off when the low level voltage of the drive signal is input to the gate electrode pad 305. By switching the fourth transistor 40 off, the gate electrode 20g of the second transistor is pulled up to the power supply voltage Vdd via the resistor 365, the second power supply electrode pad 304, the wiring 371, and the power supply line 372. Therefore, the second transistor is switched on.

When the second transistor 20 is switched on, the gate charge current Ig1 flows in the second transistor 20 via the power supply line 372, the third power supply electrode pad 306, the resistor 360, and the first power supply electrode pad 303. The magnitude of the gate charge current Ig1 is determined by the voltage across the resistor 360 and the resistance value of the resistor 360. Accordingly, when the power supply voltage Vdd is constant, the gate charge current Ig1 can be adjusted by adjusting the resistance value of the resistor 360. Similarly to the other embodiments described above, the turn-on time of the first transistor 10 can be adjusted by adjusting the gate charge current Ig1.

In the state described above, the third transistor 30 is off, and the voltage of the connection node N1 is determined by the voltage of the source of the second transistor 20.

An operation when the first transistor 10 is switched off will now be described.

The fourth transistor 40 is switched on when the high level voltage of the drive signal is input to the gate electrode pad 305. By switching the fourth transistor 40 on, the voltage of the connection node N2 between the resistor 365 and the drain electrode 40d of the fourth transistor 40 drops, and the voltage of the gate of the second transistor 20 is pulled down. Therefore, the second transistor 20 is switched off.

When the third transistor 30 is switched on by the high level voltage of the drive signal, the third transistor 30 discharges the Miller capacitance and the electrostatic capacitance between the gate and source of the first transistor 10. At this time, the discharge current is determined by the driving capability of the third transistor 30.

Thus, the switching operation of the first transistor 10 can be performed.

Effects of the semiconductor device 300 according to the embodiment will now be described.

The semiconductor device 300 according to the embodiment can adjust, by the voltage across the resistor 360 and the resistance value of the resistor 360, the gate charge current Ig1 when the second transistor 20 that turns on the first transistor 10 is switched on.

According to the embodiments described above, a semiconductor device can be realized in which the switching speed of the output stage element of a nitride semiconductor can be appropriately adjusted.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments herein may be made without departing from the spirit of the inventions. The accompanying claims and their equivalents are intended to cover such forms or modifications as would fall within the scope and spirit of the inventions. Additionally, the embodiments described above can be combined mutually.

What is claimed is:

1. A semiconductor device, comprising:
   a first transistor including
      a first drain electrode connected to a drain electrode pad,
      a first source electrode connected to a source electrode pad, and
      a first gate electrode;
   a first drive circuit connected to the source electrode pad and connected between a first electrode pad and a second electrode pad, a first voltage being input to the first electrode pad and used as a reference, a second voltage being input to the second electrode pad and being greater than the first voltage, the first drive circuit including a second transistor, the second transistor including
      a second drain electrode electrically connected to the second electrode pad, and
      a second source electrode connected to the first gate electrode of the first transistor; and
   a second drive circuit connected between the second transistor and the first electrode pad, the second drive circuit including a third transistor, the third transistor including
      a third drain electrode connected to the first gate electrode, and
      a third source electrode connected to the source electrode pad,
   the first transistor, the second transistor, and the third transistor being formed in a first substrate, the first substrate including GaN,
   the first drive circuit charging a parasitic capacitance of the first transistor,
   the second drive circuit discharging the parasitic capacitance of the first transistor, wherein
   the second transistor further includes a second gate electrode,
   the first drive circuit further includes a fourth transistor connected between the first electrode pad and the second gate electrode of the second transistor,
   the second drive circuit further includes:
      a fifth transistor included in a current mirror with the third transistor; and
      a constant current source outputting a current to the fifth transistor, the current having a current value that is variably set.

2. The device according to claim 1, wherein
   the first drive circuit further includes:
      a sixth transistor connected to the second drain electrode;
      a seventh transistor included in a current mirror with the sixth transistor; and
      a constant current circuit outputting a current to the seventh transistor, the current having a current value that is variably set.

3. The device according to claim 2, wherein
   the fifth transistor is formed in the first substrate,
   the sixth transistor and the seventh transistor are formed in a second substrate, and
   the second substrate includes Si.

4. The device according to claim 3, wherein
   the second transistor is connected to the sixth transistor via a first connection wire.

5. The device according to claim 1, wherein
   the first drive circuit outputs a first drive current to the first gate electrode,
   a current value of the first drive current is settable,
   the second drive circuit outputs a second drive current to the first gate electrode, and
   a current value of the second drive current is settable.

6. The device according to claim 1, wherein
   the first transistor, the second transistor, and the third transistor are normally-off MOS HEMTS.

7. A semiconductor device, comprising:
   a first transistor including
      a first drain electrode connected to a drain electrode pad,
      a first source electrode connected to a source electrode pad, and
      a first gate electrode;
   a first drive circuit connected to the source electrode pad and connected between a first electrode pad and a second electrode pad, a first voltage being input to the first electrode pad and used as a reference, a second voltage being input to the second electrode pad and being greater than the first voltage, the first drive circuit including a second transistor, the second transistor including
      a second drain electrode electrically connected to the second electrode pad, and
      a second source electrode connected to the first gate electrode of the first transistor; and
   a second drive circuit connected between the second transistor and the first electrode pad, the second drive circuit including a third transistor, the third transistor including
      a third drain electrode connected to the first gate electrode, and a third source electrode connected to the source electrode pad, the first transistor, the second transistor, and the third transistor being formed in a first substrate, the first substrate including GaN, the first drive circuit charging a parasitic capacitance of the first transistor, the second drive circuit discharging the parasitic capacitance of the first transistor, wherein the first drive circuit includes a plurality of the second transistors connected in parallel, and the device further comprises a first control circuit selectively driving at least one of the second transistors among the plurality of second transistors.

8. The device according to claim 7, wherein
the first drive circuit further includes:
  a fourth transistor connected to the second drain electrode;
  a fifth transistor included in a current mirror with the fourth transistor; and
  a constant current circuit outputting a current to the fifth transistor, the current having a current value that is variably set.

9. The device according to claim 8, wherein
the fourth transistor and the fifth transistor are formed in a second substrate, and
the second substrate includes Si.

10. The device according to claim 9, wherein
the second transistor is connected to the fourth transistor via a first connection wire.

11. The device according to claim 7, wherein
the first drive circuit outputs a first drive current to the first gate electrode,
a current value of the first drive current is settable,
the second drive circuit outputs a second drive current to the first gate electrode, and
a current value of the second drive current is settable.

12. The device according to claim 7, wherein
the first transistor, the second transistor, and the third transistor are normally-off MOS HEMTS.

13. A semiconductor device, comprising:
a first transistor including
  a first drain electrode connected to a drain electrode pad,
  a first source electrode connected to a source electrode pad, and
  a first gate electrode;
a first drive circuit connected to the source electrode pad and connected between a first electrode pad and a second electrode pad, a first voltage being input to the first electrode pad and used as a reference, a second voltage being input to the second electrode pad and being greater than the first voltage, the first drive circuit including a second transistor, the second transistor including
  a second drain electrode electrically connected to the second electrode pad, and
  a second source electrode connected to the first gate electrode of the first transistor; and
a second drive circuit connected between the second transistor and the first electrode pad, the second drive circuit including a third transistor, the third transistor including
  a third drain electrode connected to the first gate electrode, and
  a third source electrode connected to the source electrode pad, the first transistor, the second transistor, and the third transistor being formed in a first substrate, the first substrate including GaN, the first drive circuit charging a parasitic capacitance of the first transistor, the second drive circuit discharging the parasitic capacitance of the first transistor, wherein the second drive circuit includes a plurality of the third transistors connected in parallel, and the device further comprises a second control circuit selectively driving at least one of the third transistors among the plurality of third transistors.

14. The device according to claim 13, wherein
the first drive circuit further includes:
  a fourth transistor connected to the second drain electrode;
  a fifth transistor included in a current mirror with the fourth transistor; and
  a constant current circuit outputting a current to the fifth transistor, the current having a current value that is variably set.

15. The device according to claim 14, wherein
the fourth transistor and the fifth transistor are formed in a second substrate, and
the second substrate includes Si.

16. The device according to claim 15, wherein
the second transistor is connected to the fourth transistor via a first connection wire.

17. The device according to claim 13, wherein
the first drive circuit outputs a first drive current to the first gate electrode,
a current value of the first drive current is settable,
the second drive circuit outputs a second drive current to the first gate electrode, and
a current value of the second drive current is settable.

18. The device according to claim 13, wherein
the first transistor, the second transistor, and the third transistor are normally-off MOS HEMTS.

19. A semiconductor device, comprising:
a first transistor including
  a first drain electrode connected to a drain electrode pad,
  a first source electrode connected to a source electrode pad, a first voltage being applied to the source electrode pad and used as a reference, and
  a first gate electrode;
a first drive circuit connected between a power supply electrode pad and the source electrode pad, a second voltage being input to the power supply electrode pad, the second voltage being greater than the first voltage, the first drive circuit including a second transistor, the second transistor including
  a second drain electrode electrically connected to the power supply electrode pad, and
  a second source electrode connected to the first gate electrode of the first transistor; and
a second drive circuit including a third transistor connected between the second transistor and the source electrode pad, the third transistor including
  a third drain electrode connected to the first gate electrode, and
  a third source electrode connected to the source electrode pad, the first transistor, the second transistor, and the third transistor being normally-off MOS HEMTs, the normally-off MOS HEMTs being formed in a first substrate, the first substrate including GaN,
the first drive circuit charging a parasitic capacitance of the first transistor by outputting a first drive current to the first gate electrode,
the first drive current being variably set, wherein
the second transistor further includes a second gate electrode,
the first drive circuit further includes a fourth transistor connected between a first electrode pad and the second gate electrode of the second transistor,
the second drive circuit further includes:
   a fifth transistor included in a current mirror with the third transistor; and
   a constant current source outputting a current to the fifth transistor, the current having a current value that is variably set.

* * * * *

UNITED STATES PATENT AND TRADEMARK OFFICE
CERTIFICATE OF CORRECTION

PATENT NO. : 12,273,101 B2  
APPLICATION NO. : 18/167301  
DATED : April 8, 2025  
INVENTOR(S) : Toru Sugiyama et al.

Page 1 of 1

It is certified that error appears in the above-identified patent and that said Letters Patent is hereby corrected as shown below:

On the Title Page (73) Assignees, replace "Kabusbiki Kaisha Toshiba, Tokyo (JP)" with --Kabushiki Kaisha Toshiba, Tokyo (JP)--.

Signed and Sealed this  
Fifteenth Day of July, 2025

Coke Morgan Stewart  
*Acting Director of the United States Patent and Trademark Office*